(12) United States Patent
Yang et al.

(10) Patent No.: US 7,952,213 B2
(45) Date of Patent: May 31, 2011

(54) OVERLAY MARK ARRANGEMENT FOR REDUCING OVERLAY SHIFT

(75) Inventors: Chin Cheng Yang, Hsinchu (TW); Chun Chung Huang, Hsinchu (TW)

(73) Assignee: Macronix International Co., Ltd. (TW)

( * ) Notice: Subject to any disclaimer, the term of this patent is extended or adjusted under 35 U.S.C. 154(b) by 788 days.

(21) Appl. No.: 11/277,854

(22) Filed: Mar. 29, 2006

(65) Prior Publication Data

US 2007/0258637 A1 Nov. 8, 2007

(51) Int. Cl.
*H01L 23/544* (2006.01)
*G06K 9/00* (2006.01)
(52) U.S. Cl. ............... 257/797; 257/E23.179; 382/151
(58) Field of Classification Search ........ 438/401; 257/797, E23.179; 382/151
See application file for complete search history.

(56) References Cited

U.S. PATENT DOCUMENTS

| | | | | |
|---|---|---|---|---|
| 6,801,313 B1 * | 10/2004 | Yokota | .......................... | 356/401 |
| 7,190,824 B2 * | 3/2007 | Chen | ............................. | 382/151 |
| 7,196,429 B2 * | 3/2007 | Yen et al. | ...................... | 257/797 |
| 7,449,792 B2 * | 11/2008 | Yang et al. | .................... | 257/797 |

* cited by examiner

*Primary Examiner* — W. David Coleman
(74) *Attorney, Agent, or Firm* — Baker & McKenzie LLP

(57) ABSTRACT

An overlay mark arrangement for reducing the asymmetric profile and an overlay shift during an integrated circuit manufacturing process is disclosed. In one embodiment, the overlay mark arrangement may comprise a first mark, a second mark and a stress releasing means. The first mark is used to indicate the position of a lower layer, the second mark is used to indicate the position of an upper layer; and the stress releasing means is used to release the film stress induced by the upper layer. Unlike the conventional overlay mark arrangements, which will have a severe overlay mark shift due to the film stress, the asymmetric overlay mark profile can be improved by using multiple trenches around the overlay marks according to certain embodiments of the invention disclosed herein.

23 Claims, 6 Drawing Sheets

OVERLAY MARK ARRANGEMENT FOR REDUCING OVERLAY SHIFT

BACKGROUND OF THE INVENTION

1. Field of the Invention

Certain embodiments of the present invention relate, in general, to an improved semiconductor manufacturing process, and in particular, to an-overlay mark design to reduce the overlay shift during the semiconductor manufacturing process.

2. Description of the Related Art

Integrated circuits (ICs) are formed by providing one or more layers sequentially on a semiconductor substrate. These layers can include a polysilicon layer, dielectric layers such as oxide or nitride layers, and metal layers such as silicide, tungsten, and copper layers. The layers can be patterned or etched to form IC parts or features. In recent years, the sizes of integrated circuit devices have continued to decrease thereby increasing the packing densities of these devices considerably. As the result, the performance of the integrated circuit devices has been improved while reducing the manufacturing cost.

However, smaller process parameters cause problems relating to the performance of these integrated circuit devices. For example, one of the most critical process control techniques used in the manufacturing of ICs is the measurement of overlay accuracy between the successive, patterned layers on a semiconductor substrate. Generally, overlay marks are used to make sure that the successive, patterned layers are deposited in proper positions. One of the most commonly used overlay patterns is having a box within a bigger box in the scribe line areas outside the IC core or device area. FIG. 1 illustrates a typical "box" type overlay mark. The inner box is typically printed on the top layer of the semiconductor substrate being produced, while the open-centered outer box is printed on the second top layer of the semiconductor substrate. The measurement process thus involves imaging of the target on an electronic camera or a microscope system, at high magnification and with high resolution in both x and y directions.

Shown in FIGS. 2A and 2B are a top view and a cross-sectional view of a portion of an integrated circuit memory device according to a conventional overlay mark structure. In this conventional structure, four distinctive overlay marks or so-called "box to box overlay marks" are employed to form two chopped boxes in an inner bar 205 and an outer bar 201 for alignment purpose. FIG. 2B shows a cross-sectional view of a portion of an integrated circuit memory device after the metal patterning photoresist developing has been performed. It includes an interlayer dielectric (ILD) layer 212 on a semiconductor substrate 210, a plurality of contact openings (not shown in the figure), a metal layer 214 such as an AlCu layer and a metal cap layer such as a Ti/TiN composite layer 216 over the openings and the entire surface, and a photoresist mask 218 formed over the metal layer 214. Ideally, the remaining metal mark after the metal etch step should have no wafer induced overlay shift between the contact opening and the metal line. In reality, however, a wafer induced overlay shift exists between the contact opening and the metal line because of the overlay mark profile becoming asymmetric after the metal line film deposition step. The wafer edge has a larger overlay shift compared to the wafer center after the metal film deposition step. Such an overlay shift is called "scalling effect." There are two causes to induce such phenomena. One is a self-shadowing effect on the mark depth and the deposition angle as illustrated in FIG. 6. The other is caused by the metal stress 214 on the wafer surface. Moreover, a severe metal line scaling effect can result as the metal line thickness is increased due to the higher metal stress.

Referring now to FIG. 3A, a portion of a partially completed semiconductor device is shown. The figure shows a portion of a device region 310 on the right hand side and also a portion of a scribe region 330 on which the overlay marks will be built on the left hand side.

First, the transistor structure including a gate, a drain, and source regions (not shown in the figures) are formed on a semiconductor substrate 300. Thereafter, the structures are patterned by the conventional photolithography and etching techniques. Next, an interlayer dielectric (ILD) layer 302 is first formed over the entire semiconductor substrate. Thereafter, contact openings 305 are formed. A first metal layer structure 304 is then deposited and etched backed to form a metal plug in the device area, and the metal residues are left in the sidewalls of the overlay mark in the scribe line area as shown in FIG. 3A. Then, a second metal layer structure 308 is deposited to form the first metal interconnect layer over the entire semiconductor substrate 300 as shown in FIG. 3A.

In one example, the first metal layer 304 is a tungsten layer formed by the conventional chemical vapor deposition (CVD) technology. As shown in FIG. 3B, going from the bottom to the top on the ILD layer 302, the multilayer metal film scheme 308 may include a TiN underlayer 308a, and an Al metal layer 308b, and Ti 308c and TiN 308d top layers. In another example, the thickness of each layer is in the range of 300 to 600 angstroms for a TiN underlayer 308a, in the range of 2000 to 10000 angstroms for an Al metal layer 308b, in the range of 100 to 300 angstroms for a Ti 308c layer, and in the range of 200 to 600 angstroms for a TiN 308d to layer.

Referring now more particularly to FIG. 3C, a portion of a partially completed semiconductor device after the photoresist coating and exposure steps is shown. The figure also shows a portion of a device region 310 on the right hand side and also a portion of a scribe line region 330 on which the overlay marks will be built on the left hand side. Since the top metal layer has higher stress compared with the underlying ILD layer, the edge of the metal profile 309 becomes asymmery after the metal deposition process steps. It causes the remaining photoresist patterns 312 to shift from the ideal symmatry profile slightly toward the left. When performing the overlay shift measurement, the actual overlay will be A1 and B1 compared with the ideal situation of A and B. Therefore, after the metal etch step, so called "scalling effect" occurs, resulting in the metal patterns 308a not completely covering the contact hole in the device area 305b as shown in FIG. 3D. This type of misalignment will severely effect the electrical performance and reliability of the integrated circuits.

Therefore, there is a need for a new and improved overlay mark design which can effectively solve the above-mentioned problems in the prior art method.

SUMMARY OF THE INVENTION

The present invention is directed to solve these and other disadvantages of the prior art processes. An overlay mark arrangement to reduce the asymmetric overlay shift during an integrated circuit manufacturing process is disclosed. Unlike the conventional overlay mark arrangement, which causes a severe overlay mark shift due to the film stress, multiple trenches near the overlay marks are placed around the scribe line, and the asymmetric overlay mark profile can be improved by releasing the whole wafer metal stress using the buffer trenches.

One embodiment contemplates employing an overlay mark design for measuring the relative positions between a lower layer material and an upper layer material. The overlay mark arrangement comprises a first mark, a stress releasing means, and a second mark. The first mark is used to indicate the position of a lower layer, the second mark is used to indicate the position of an upper layer, and the stress releasing means is used to release the film stress induced by the upper layer.

In another embodiment, measuring the overlay mark arrangement may comprise a first mark, at least one buffer trench, and a second mark. The first mark is used to indicate the position of a lower layer and the at least one buffer trench is used to release the film stress induced by the upper layer, and the second mark is used to indicate the position of an upper layer.

Alternatively, the overlay mark arrangement may comprise a mark, and at least one buffer trench. The mark is used to indicate the position on a semiconductor substrate; and at least one buffer trench is used to release the film stress induced by the upper layer.

BRIEF DESCRIPTION OF THE DRAWINGS

The accompanying drawings are included to provide a further understanding of certain embodiments of the present invention, and are incorporated in and constitute a part of the description to certain embodiments of this invention. The drawings illustrate certain embodiments of the present invention, and together with the description, serve to explain the principles of certain embodiments of the present invention. There is shown.

DESCRIPTION OF THE PREFERRED EMBODIMENT

Certain embodiments of the invention disclosed herein is generally directed to an overly mark design for measuring the relative positions between a lower layer material and an upper layer material. In the following description, numerous details are set forth in order to provide a thorough understanding of certain embodiments of the present invention. It will be appreciated by one skilled in the art that variations of these specific details are possible while still achieving the results disclosed in certain embodiments of the present invention. In other instances, well-known processing steps are not described in detail in order not to unnecessarily obscure certain aspects of the present invention.

Figure 1:
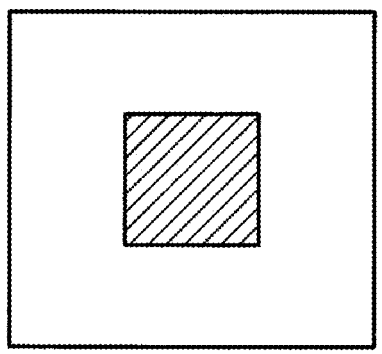
FIG. 1 illustrates a typical conventional "box" type overlay mark.
Figure 2:
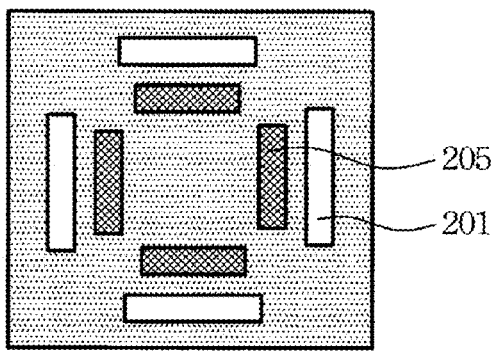
FIG. 2A illustrates a conventional "box to box-overlay marks" structure.
FIG. 2B shows the cross-sectional view of a portion of a conventional integrated circuit device after the metal photoresist patterning step.
Figure 2:
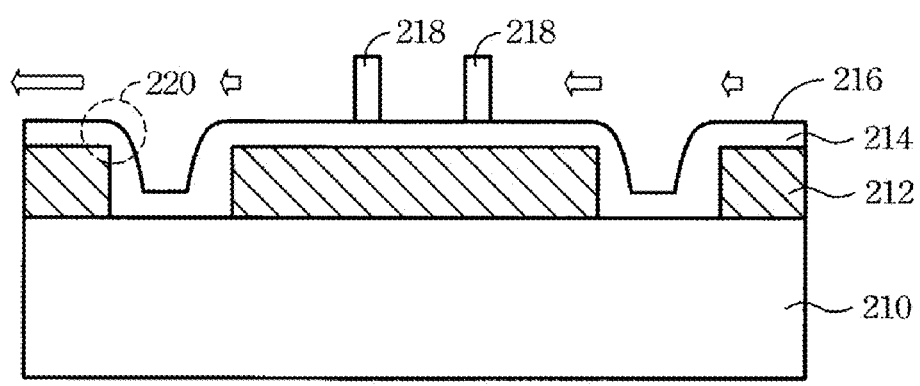
Figure 3:
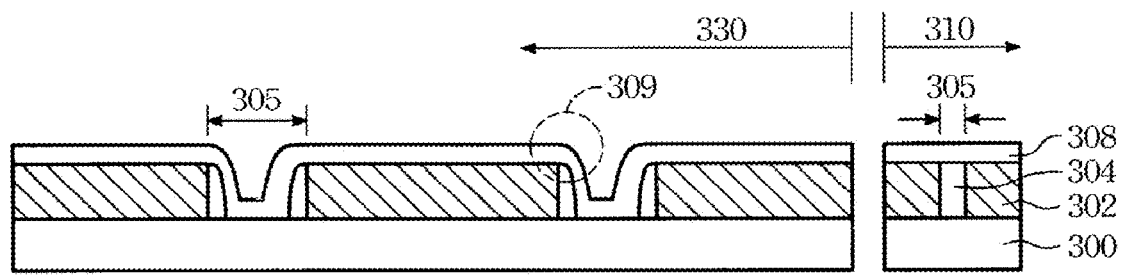
FIG. 3A shows a portion of a partially completed semiconductor device.
FIG. 3B shows an enlarged portion of the second metal layer structure.
FIG. 3C shows a portion of a partially completed semiconductor device after the photoresist coating and exposure steps.
FIG. 3D shows a portion of a partially completed semiconductor device after the metal etching step.
Figure 3:
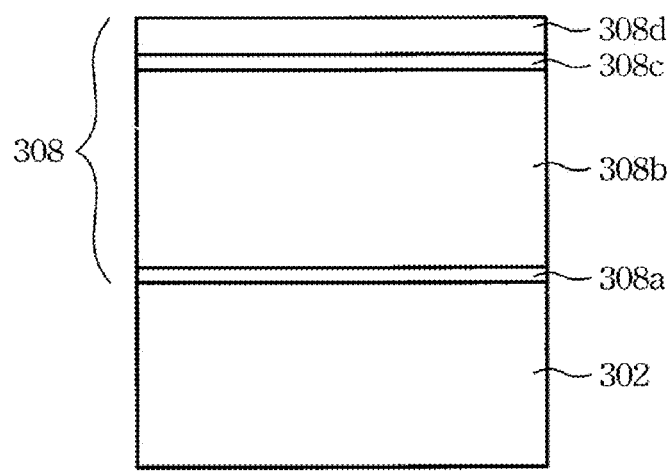
Figure 3:
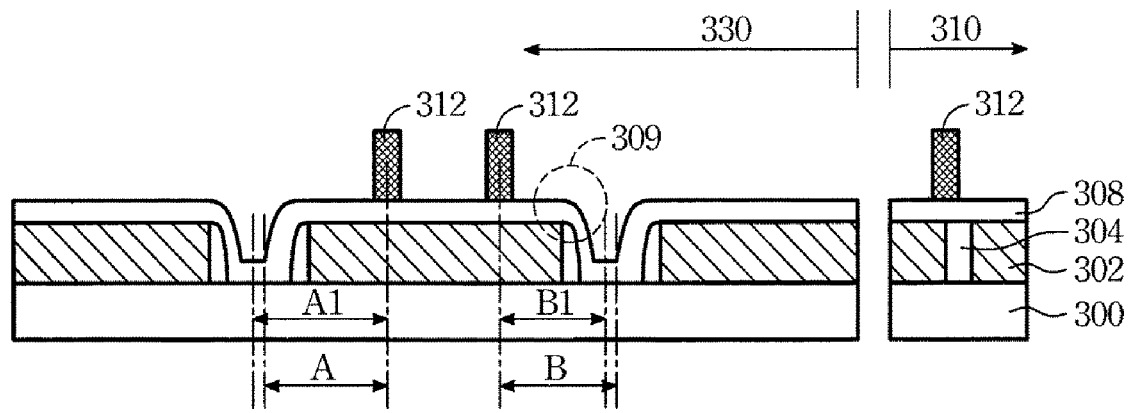
Figure 3:
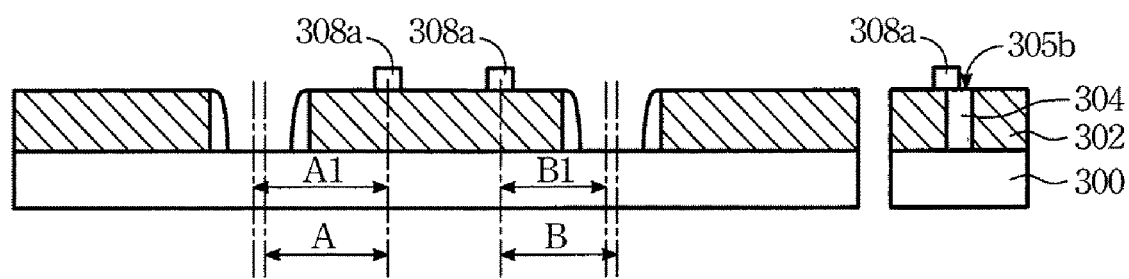
Figure 4:
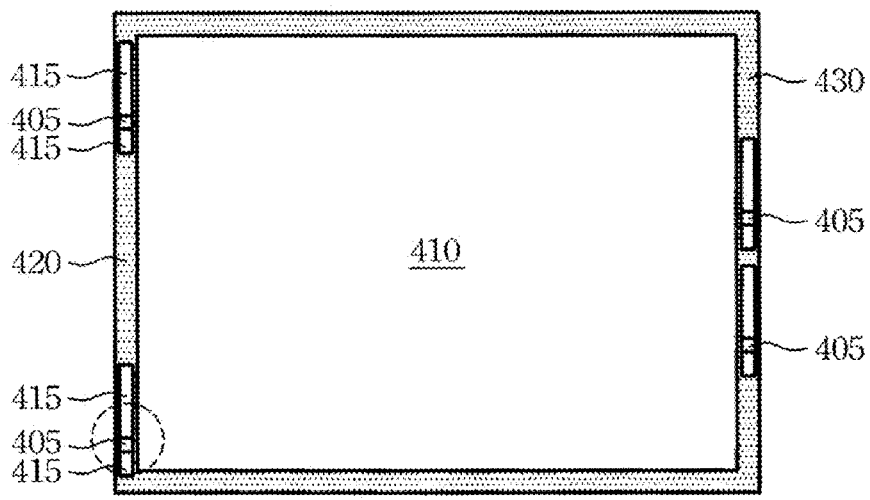
FIG. 4A illustrates a top view of an overlay mark arrangement according to one embodiment of the present invention.
FIG. 4B illustrates an enlarged top view of an overlay mark according to one embodiment of the present invention.
FIG. 4C illustrates a side view of an overlay mark arrangement according to one embodiment of the present invention.
Figure 4:
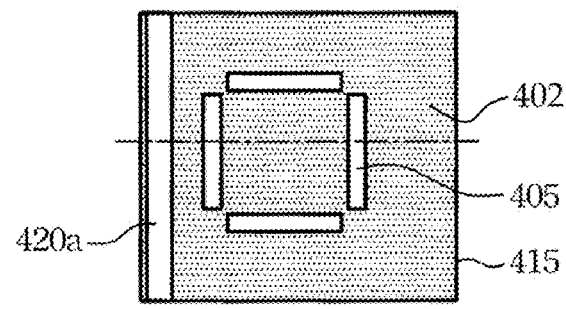
Figure 4:
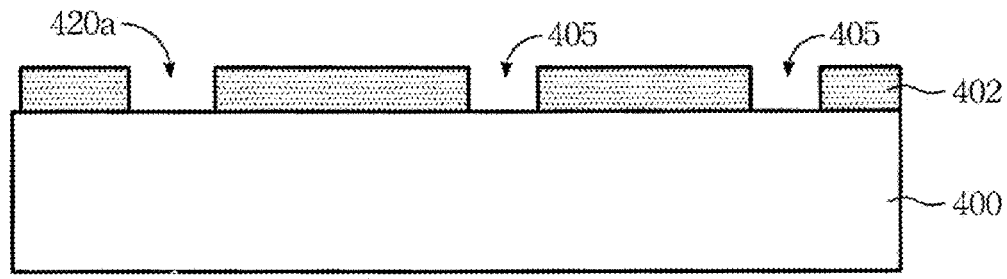

Referring to FIGS. 4A, 4B, and 4C, a top view, an enlarged top view, and a side view according to one embodiment are disclosed. Referring now more particularly to FIG. 4A, there is shown a top view of an overlay mark arrangement. Area 430 refers to the area between the box enclosing the device area 410 and the outer box in FIG. 4A, and will be referred as the scribe line area hereinafter. The width of the scribe line may range from 60 um to 120 um. Area 415 is designed for placing an overlay mark of an etch layer. Typically, overlay marks 405 are located within the scribe line 430 located outside of the active device area 410. Here, an overlay mark 405 is dedicated for an ILD layer and is located in area 415. In one embodiment, overlay marks 405 comprise four distinctive overlay marks, with two overlay marks 405 located in the scribe lines 430 on each side as shown in these Figures. Buffer trenches 420 for releasing the film stress can be used around the scribe line. In the embodiment shown in FIG. 4B, at least one outer trench 420a is used to indicate the position of the lower layer. However, two trenches located around both sides of the scribe line area or even multiple trench segments can be used in one side or both sides around the scribe line area. As shown in FIG. 4C, from the side view of the wafer 400, a stress buffer trench 402a on the ILD layer 402 is located on the left hand side corresponding to FIG. 4B. The buffer trench may have the same width compared with the overlay marks. Alternatively, the buffer trench can have a wider width compared to the overlay marks.

Figure 5:
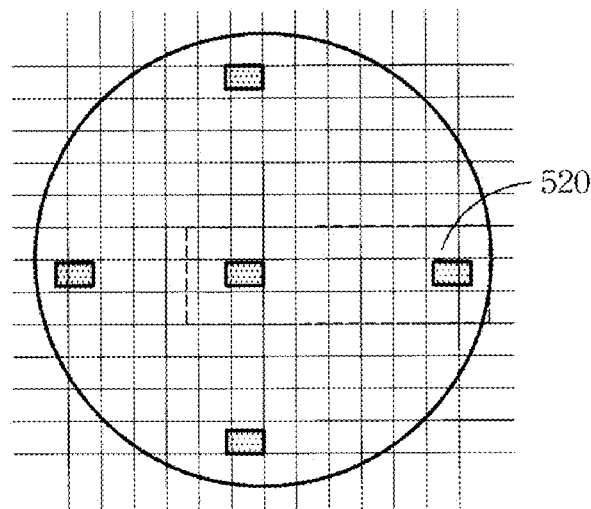
FIG. 5A illustrates a top view of an overlay mark arrangement on a wafer surface according to one embodiment of the present invention.
FIG. 5B illustrates an enlarged top view of an overlay mark arrangement effect which can reduce the stress induced by the top metal layer according to one embodiment of the present invention.
FIG. 5C illustrates an enlarged top view of an overlay mark arrangement effect in which the stress is induced by the top metal layer according to the prior art.
FIG. 5D illustrates a side view of an overlay mark arrangement effect which can reduce the stress induced by the top metal layer according to one embodiment of the present invention.
FIG. 5E illustrates a side view of an overlay mark arrangement effect in which the stress is induced by the top metal layer according to the prior art.
Figure 5:
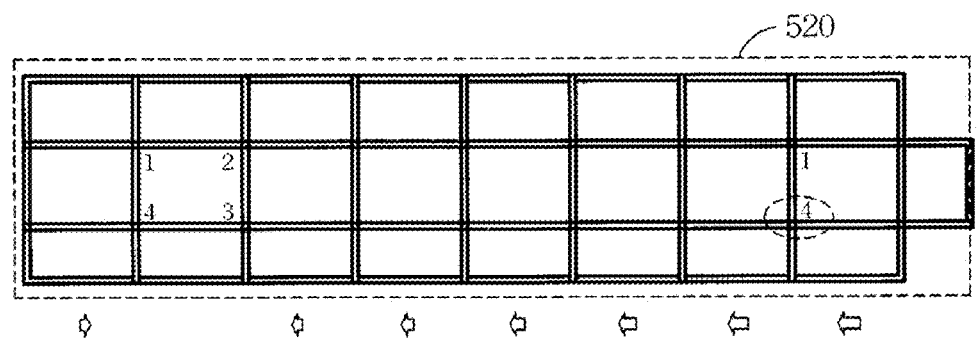
Figure 5:
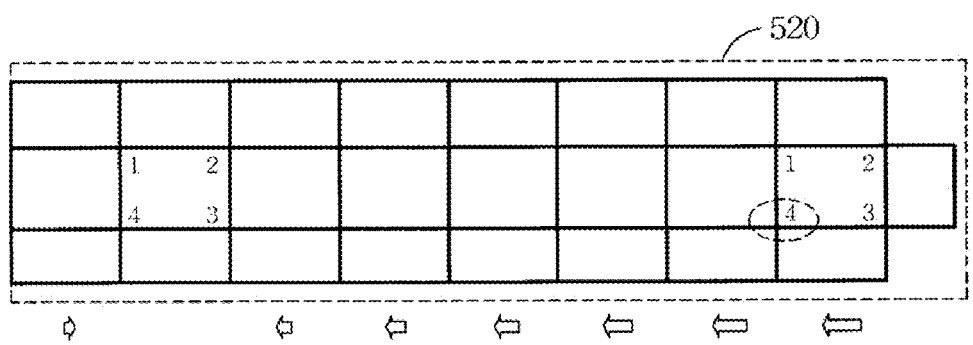
Figure 5:
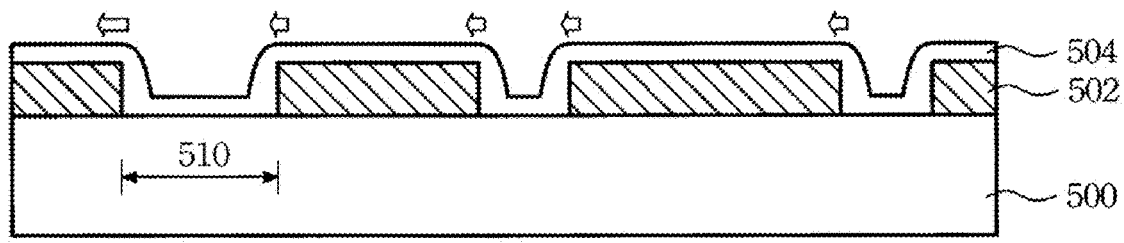
Figure 5:
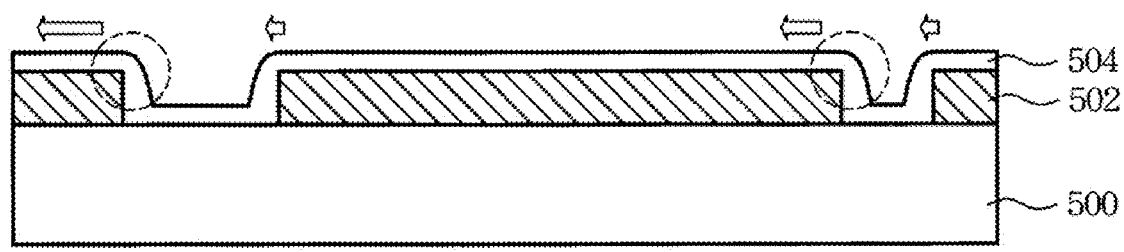
Figure 6:
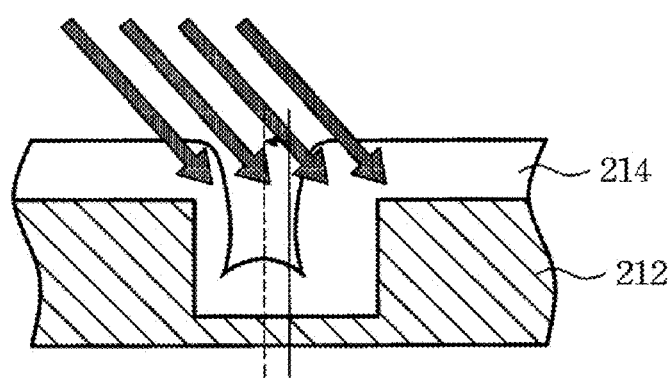
FIG. 6 shows an exemplary figure showing a so-called "self-shadowing effect" on the mark depth and the deposition angle according to the prior art.

FIG. 5A illustrates a top view of the overlay mark arrangement on a wafer surface according to one embodiment. FIGS. 5B and 5C show the comparison of the stress differences between one embodiment of the present invention and the prior art system on an enlarged portion 520. FIG. 5B clearly shows that the effect of the stress induced by the metal film is reduced. Trenches are created in the scribe lines around the active area of the integrated circuit, and the stress in the wafer edge can be reduced greatly as shown in FIG. 5B. The bigger arrows in FIG. 5C show greater stress that exists in the prior art. Similarly, as shown from the side view of the wafer 500 in 5D, a trench 510 is created in the scribe lines around the active area of the integrated circuit, and the stress induced by the metal film 504 on the ILD layer 502 in the wafer edge can be reduced greatly. Unlike the conventional overlay mark arrangement shown in FIG. 5E, which will have a severe overlay mark shift due to the film stress, the asymmetric overlay mark profile can be improved with the design using multiple trenches around the overlay marks as shown in certain embodiments of the present invention.

According to the overlay mark arrangement shown in certain embodiments of the present invention, it offers many advantages over the prior art, some of which are summarized below:

1. The overlay mark arrangement shown in certain embodiments of the present invention can reduce the metal film induced stress.
2. The overlay mark arrangement shown in certain embodiments of the present invention can also reduce the effect of the overlay mark profile being asymmetric.
3. The overlay mark arrangement shown in certain embodiments of the present invention can reduce the overlay shift phenomena, especially in the wafer edge area.
4. The overlay mark arrangement shown in certain embodiments of the present invention can improve the total wafer yield.

It will be apparent to those skilled in the art that various modifications and variations can be made in the disclosed embodiments without departing from the scope or spirit of the present invention. Other embodiments of the invention will be apparent to those skilled in the art from consideration of the specification and practice of the invention disclosed herein. It is intended that the specification and examples provided herein be considered as exemplary only, with a true scope of the invention being indicated by the following claims and their equivalents.

What we claimed is:

1. An overlay mark design, comprising:
   a first mark for indicating the position of a lower layer;
   a second mark for indicating the position of an upper layer;
   a stress releasing means for releasing the stress induced by the upper layer; and
   a scribe line that includes an outer box and an inner box, wherein buffer trenches for film stress release have a wider width than either the first or second marks and are located around the scribe line.

2. The overlay mark design according to claim 1, wherein said first mark has a lower profile than said second mark.

3. The overlay mark design according to claim 1, wherein said stress releasing means has a width same or larger than the overlay mark width.

4. The overlay mark design according to claim 1, wherein said stress releasing means is located within the scribe line.

5. The overlay mark design according to claim 1, wherein said stress releasing means comprises one or more buffer trenches.

6. The overlay mark design according to claim 1, wherein said first mark comprises a plurality of distinctive overlay marks.

7. The overlay mark design according to claim 5, wherein each of said buffer trenches comprises a single trench along said first mark.

8. The overlay mark design according to claim 5, wherein each of said buffer trenches comprises a plurality of trenches around said first mark.

9. An overlay mark design, comprising:
   a first mark for indicating the position of a lower layer;
   a second mark for indicating the position of an upper metal layer;
   a buffer trench to release the stress induced by the upper metal layer; and
   a scribe line that includes an outer box and an inner box, wherein the buffer trench for film stress release has a wider width than either the first or second marks and is located around the scribe line.

10. The overlay mark design according to claim 9, wherein said upper metal layer is a composite metal layer.

11. The overlay mark design according to claim 9, wherein said buffer trench is around the scribe line.

12. The overlay mark design according to claim 9, wherein said buffer trench comprises a single trench along said first mark.

13. The overlay mark design according to claim 9, wherein said buffer trench comprises a plurality of trenches around said first mark.

14. The overlay mark design according to claim 9, wherein said first mark comprises a plurality of distinctive overlay marks.

15. The overlay mark design according to claim 10, wherein said composite metal layer comprises an upper metal layer having higher stress than said lower layer.

16. The overlay mark design according to claim 15, wherein said upper metal layer comprises a Ti/TiN/AiCu layer, and said lower layer comprises an oxide layer.

17. An overlay mark design, comprising:
   a mark to indicate a position on a semiconductor substrate;
   a buffer trench to release the stress induced by an upper metal layer; and
   a scribe line that includes an outer box and an inner box, wherein the buffer trench for film stress release has a wider width than either the first or second marks and is located around the scribe line.

18. The overlay mark design according to claim 17, wherein said upper metal layer is a composite metal layer.

19. The overlay mark design according to claim 17, wherein said buffer trench is around the scribe line.

20. The overlay mark design according to claim 17, wherein said buffer trench comprises a single trench along said mark.

21. The overlay mark design according to claim 17, wherein said buffer trench comprises a plurality of trenches around said mark.

22. The overlay mark design according to claim 18, wherein said composite metal layer comprises an upper metal layer having higher stress than a lower ILD film.

23. The overlay mark design according to claim 22, wherein said upper metal layer comprises a Ti/TiN/AlCu layer, and said lower ILD layer comprises an oxide layer.

* * * * *